(12) United States Patent
Lee et al.

(10) Patent No.: US 10,026,489 B2
(45) Date of Patent: Jul. 17, 2018

(54) SEMICONDUCTOR MEMORY DEVICE AND OPERATING METHOD THEREOF

(71) Applicant: SK hynix Inc., Icheon-si, Gyeonggi-do (KR)

(72) Inventors: Hee Youl Lee, Icheon-si (KR); Hye Eun Heo, Yongin-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/237,972

(22) Filed: Aug. 16, 2016

(65) Prior Publication Data
US 2017/0263327 A1    Sep. 14, 2017

(30) Foreign Application Priority Data

Mar. 8, 2016   (KR) .......................... 10-2016-0027767

(51) Int. Cl.
| | |
|---|---|
| G11C 16/24 | (2006.01) |
| G11C 16/34 | (2006.01) |
| G11C 16/10 | (2006.01) |
| G11C 16/26 | (2006.01) |
| G11C 16/16 | (2006.01) |

(52) U.S. Cl.
CPC .......... *G11C 16/3459* (2013.01); *G11C 16/10* (2013.01); *G11C 16/16* (2013.01); *G11C 16/26* (2013.01)

(58) Field of Classification Search
CPC ................................ G11C 16/10; G11C 16/26
USPC ......................................... 365/185.22, 185.24
See application file for complete search history.

(56) References Cited

U.S. PATENT DOCUMENTS

| | | | | | |
|---|---|---|---|---|---|
| 6,002,614 | A  * | 12/1999 | Banks | .................. | G11C 11/5621 365/189.09 |
| 6,643,188 | B2 * | 11/2003 | Tanaka | ................ | G11C 11/5628 365/185.01 |
| 6,714,457 | B1 * | 3/2004 | Hsu | ...................... | G11C 11/5628 365/185.03 |
| 7,596,026 | B2 * | 9/2009 | Kwon | ................ | G11C 16/0483 365/185.14 |
| 8,879,318 | B2 * | 11/2014 | Ahn | .................... | G11C 16/3459 365/185.03 |
| 9,318,203 | B2 * | 4/2016 | Lee | ........................ | G11C 16/10 |
| 9,330,766 | B1 * | 5/2016 | Jung | ...................... | G11C 16/10 |

(Continued)

FOREIGN PATENT DOCUMENTS

| | | |
|---|---|---|
| KR | 1020140074552 A | 6/2014 |
| KR | 1020150091684 A | 8/2015 |

*Primary Examiner* — Michael Tran
(74) *Attorney, Agent, or Firm* — William Park & Associates Ltd.

(57) ABSTRACT

The present technique relates to an electronic device, and more particularly, to a semiconductor memory device and an operating method thereof. A semiconductor memory device having improved reliability includes an address decoder applying a program voltage to a selected word line coupled to selected memory cells, among the plurality of memory cells, and a read and write circuit applying a program permission voltage or a program inhibition voltage to bit lines coupled to the selected memory cells, and a control logic controlling the read and write circuit to sequentially apply the program permission voltage and the program inhibition voltage to the bit lines coupled to the selected memory cells when the program voltage is applied.

20 Claims, 12 Drawing Sheets

(56) References Cited

U.S. PATENT DOCUMENTS

| | | | |
|---|---|---|---|
| 9,349,461 B1* | 5/2016 | Pan | G11C 16/10 |
| 9,466,375 B1* | 10/2016 | Lin | G11C 16/08 |
| 9,472,282 B2* | 10/2016 | Lee | G11C 13/0069 |
| 9,627,071 B2* | 4/2017 | Lim | G11C 16/10 |
| 2013/0088917 A1* | 4/2013 | Park | G11C 11/5628 365/185.03 |
| 2014/0063968 A1* | 3/2014 | Shim | G11C 16/0483 365/185.19 |
| 2015/0221374 A1* | 8/2015 | Lee | G11C 16/0483 365/185.11 |

* cited by examiner

SEMICONDUCTOR MEMORY DEVICE AND OPERATING METHOD THEREOF

CROSS-REFERENCE TO RELATED APPLICATION

The present application claims priority under 35 U.S.C. § 119(a) to Korean patent application number 10-2016-0027767 filed on Mar. 8, 2016, in the Korean Intellectual Property Office, the entire disclosure of which is incorporated by reference herein.

BACKGROUND

1. Technical Field

Various embodiments relate generally to an electronic device, more particularly, to a semiconductor memory device and an operating method thereof.

2. Related Art

A semiconductor memory device is a memory device embodied using semiconductors made from materials such as silicon (Si), germanium (Ge), gallium arsenide (GaAs), and indium phosphide (InP). Semiconductor memory devices are classified into volatile memory devices and non-volatile memory devices.

Volatile memory devices lose stored data when powered off. Examples of volatile memory devices include Static RAM (SRAM), Dynamic RAM (DRAM), and Synchronous DRAM (SDRAM). Non-volatile memory devices retain stored data regardless of power on/off conditions. Examples of non-volatile memory devices include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM), and Ferroelectric RAM (FRAM). Flash memories are classified into NOR-type memories and NAND-type memories.

SUMMARY

Various embodiments relate to a semiconductor memory device having improved reliability and an operating method thereof.

According to an embodiment, a method of operating a semiconductor memory device including a plurality of memory cells may include applying a program voltage to a selected word line coupled to selected memory cells, among the plurality of memory cells. The method also includes sequentially applying a program permission voltage and a program inhibition voltage to bit lines coupled to the selected memory cells when the program voltage is applied.

According to an embodiment, a semiconductor memory device including a plurality of memory cells may include an address decoder configured to apply a program voltage to a selected word line coupled to selected memory cells, among the plurality of memory cells. The semiconductor device also includes a read and write circuit configured to apply a program permission voltage or a program inhibition voltage to bit lines coupled to the selected memory cells, and a control logic configured to control the read and write circuit to sequentially apply the program permission voltage and the program inhibition voltage to the bit lines coupled to the selected memory cells when the program voltage is applied.

DETAILED DESCRIPTION

Figure 1:
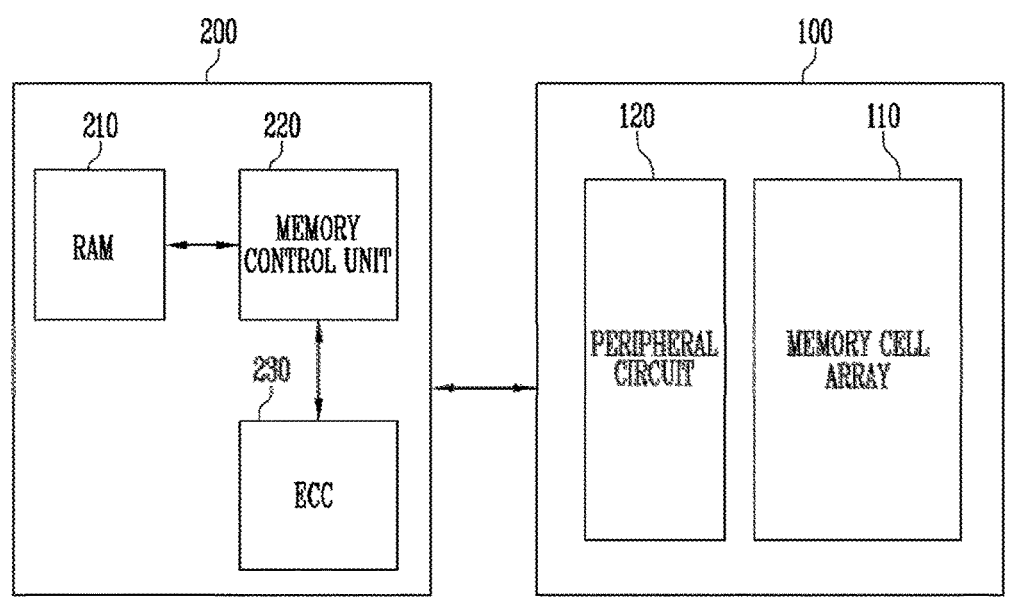
FIG. 1 is a block diagram illustrating a configuration of a memory system.

Various embodiments may relate to a semiconductor memory device having improved reliability and an operating method thereof. Specific structural or functional descriptions of example embodiments in accordance with concepts which are disclosed in this specification are illustrated only to describe the example embodiments in accordance with the concepts and the example embodiments in accordance with the concepts may be carried out by various forms of the described embodiments but the descriptions are not limited to the example embodiments described in this specification.

Various modifications and changes may be applied to the example embodiments in accordance with the concepts so that the example embodiments will be illustrated in the drawings and described in the specification. However, the example embodiments according to the concepts are not limited to the specific embodiments, but include all changes, equivalents, or alternatives which are included in the spirit and technical scope of the present disclosure.

Terminologies such as first or second may be used to describe various components but the components are not limited by the above terminologies. The above terminologies are used to distinguish one component from another component, for example, a first component may be referred to as a second component without departing from a scope in accordance with the concept of the present disclosure and similarly, a second component may be referred to as a first component.

It should be understood that, when it is described that an element is "coupled" or "connected" to another element, the element may be directly coupled or directly connected to the other element or coupled or connected to the other element through a third element. On the contrary, it should be understood that when an element is referred to as being "directly connected to" or "directly coupled to" another element, another element does not intervene therebetween. Other expressions which describe a relationship between components, that is, "between" and "directly between", or "adjacent to" and "directly adjacent to" need to be interpreted in the same manner.

Terminologies used in the present specification are used only to describe specific examples of embodiments, and are not intended to limit the present disclosure. A singular form may include a plural form if there is no clearly opposite meaning in the context. In the present specification, it should be understood that terms "include" or "have" indicate that a feature, a number, a step, an operation, a component, a part or the combination those of described in the specification is present, but do not exclude a possibility of presence or addition of one or more other features, numbers, steps, operations, components, parts or combinations thereof, in advance.

If it is not contrarily defined, all terms used herein including technological or scientific terms have the same meaning as those generally understood by a person with ordinary skill in the art. Terminologies which are defined in a generally used dictionary should be interpreted to have the same meaning as the meaning in the context of the related art but are not interpreted as an ideally or excessively formal meaning if the terms are not clearly defined in this specification.

In some embodiments, well-known processes, device structures, and technologies will not be described in detail to avoid ambiguousness of the present disclosure.

Hereinafter, the present disclosure will be described by explaining examples of embodiments with reference to the accompanying drawings.

FIG. 1 is a block diagram illustrating a configuration of a memory system.

A memory system 50 may include a semiconductor memory device 100 and a controller 200.

The semiconductor memory device 100 may include a NAND flash memory, a vertical NAND flash memory, a NOR flash memory, a resistive random access memory (RRAM), a phase-change memory (PRAM), a magnetoresistive random access memory (MRAM), a ferroelectric random access memory (FRAM), and a spin transfer torque random access memory (STT-RAM). In addition, the semiconductor memory device 100 may have a three-dimensional array structure. The disclosure may be applicable to a charge trap flash CTF having a charge storage layer including an insulating layer as well as a flash memory device having a charge storage layer including a floating gate FG.

The semiconductor memory device 100 may include a memory cell array 110 and a peripheral circuit 120 for driving the memory cell array 110. The memory cell array 110 may include a plurality of non-volatile memory cells.

The memory cell array 110 may include a plurality of memory blocks. The plurality of memory blocks may be divided into system blocks and user blocks according to their purpose.

According to an embodiment, the memory cell array 110 may include a content addressable memory (CAM) region. The CAM region may include a plurality of memory cells included in at least one memory block. Various types of setup information necessary to perform operations of the semiconductor memory device 100 may be stored in the CAM region. For example, various conditions set in relation to data input and output operations or other information may be stored in the CAM region. According to an embodiment, P/E cycles and information about a defective column address and a defective block address may be stored in the CAM region. According to an embodiment, option information necessary for the semiconductor memory device 100 to operate, for example, program voltage information, read voltage information, erase voltage information, or information about a thickness of a gate oxide layer of a cell may be stored in the CAM region. According to an embodiment, information about voltages applied to a bit line during a program operation may be stored in the CAM region.

When power is applied to the semiconductor memory device 100, the information stored in the CAM region may be read by the peripheral circuit 120, and the peripheral circuit 120 may control the memory cell array 110 to perform data input and output operations on the memory cells according to conditions set based on the read information.

The peripheral circuit 120 may operate in response to control of the controller 200. The peripheral circuit 120 may program the memory cell array 110 with data in response to control of the controller 200. The peripheral circuit 120 may read data from the memory cell array 110 and erase the data from the memory cell array 110.

According to various embodiments, a read operation and a program operation of the semiconductor memory device 100 may be performed in page units. An erase operation of the semiconductor memory device 100 may be performed in memory block units.

During a program operation, the peripheral circuit 120 may receive a command indicating the program operation, a physical block address PBA, and write data from the controller 200. When a single memory block and a single page included in the corresponding memory block are selected by the physical block address PBA, the peripheral circuit 120 may program the selected page with data.

During a read operation, the peripheral circuit 120 may receive a command indicating the read operation (hereinafter, a read command) and the physical block address PBA from the controller 200. The peripheral circuit 120 may read data from the single memory block and the single page included therein which are selected by the physical block address PBA, and output the read data (hereinafter, page data) to the controller 200.

During an erase operation, the peripheral circuit 120 may receive a command indicating the erase operation and the physical block address PBA from the controller 200. The physical block address PBA may specify a single memory block. The peripheral circuit 120 may erase data of the memory block corresponding to the physical block address PBA.

The controller 200 may control general operations of the semiconductor memory device 100. The controller 200 may access the semiconductor memory device 100 in response to a request from an external host. The controller 200 may command the semiconductor memory device 100 in response to the request from the external host.

According to an embodiment, the controller 200 may control the semiconductor memory device 100 to perform a program operation, a read operation, or an erase operation. During the program operation, the controller 200 may provide a program command, an address, and data to the semiconductor memory device 100 through a channel. During the read operation, the controller 200 may provide a read command and an address to the semiconductor memory device 100 through the channel. During the erase operation, the controller 200 may provide an erase command and an address to the semiconductor memory device 100 through the channel.

The controller 200 may include a random access memory (RAM) 210, a memory control unit 220, and an error correction circuit 230.

The RAM 210 may operate in response to control of the memory control unit 220 and serve as a work memory, a buffer memory, and a cache memory. When the RAM 210 is used as work memory, data processed by the memory control unit 220 may be temporarily stored. When the RAM 210 is used as buffer memory, the RAM 210 may be used to buffer data to be transferred to the semiconductor memory device 100 from a host (not illustrated), or to the host (not illustrated) from the semiconductor memory device 100.

The memory control unit 220 may be configured to control a read operation, a program operation, an erase operation, and a background operation of the semiconductor memory device 100. The memory control unit 220 may be configured to drive firmware for controlling the semiconductor memory device 100.

The memory control unit 220 may function as a flash translation layer FTL. The memory control unit 220 may translate a logical block address LBA provided by the host into the physical block address PBA through the flash translation layer FTL. The flash translation layer FTL may receive the logical block address LBA and translate the logical block address LBA into the physical block address PBA by using a mapping table. There are various address mapping methods for the flash translation layer FTL, depending on a mapping unit. Typical address mapping methods may include a page mapping method, a block mapping method, and a hybrid mapping method.

The error correction code circuit 230 may generate parity which is an error correction code (ECC) for data to program. In addition, during a read operation, the error correction code circuit 230 may correct an error in the read page data by using the parity. The error correction code circuit 230 may correct an error by using coded modulation, such as low density parity check (LDPC) code, Bose-Chaudhuri-Hocquenghem (BCH) code, turbo code, Reed-Solomon code, convolution code, recursive systematic code (RSC), trellis-coded modulation (TCM), Block coded modulation (BCM), and hamming code.

During the read operation, the error correction code circuit 230 may correct an error in the read page data. When the read page data includes error bits exceeding the number of correctable bit errors, decoding may fail. When the page data includes error bits less than or equal to the number of correctable error bits, decoding may succeed.

A decoding success may indicate that the corresponding read command passes. A decoding failure may indicate that the corresponding read command failed. When decoding succeeds, the controller 200 may output the error-corrected page data to the host.

Though not illustrated, the controller 200 may further include a memory interface for communication with the semiconductor memory device 100. The memory interface may include a protocol for communication with the semiconductor memory device 100. For example, the memory interface may include at least one of a plurality of flash interfaces, such as a NAND interface and a NOR interface.

In addition, the controller 200 may further include a host interface (not illustrated) for performing data exchange between the host and the controller 200. The host interface may include a protocol for communication between the host and the controller 200. For example, the controller 200 may communicate with an external device (host) through at least one of various interface protocols such as Universal Serial Bus (USB) protocol, MultiMedia Card (MMC) protocol, Peripheral Component Interconnection (PCI) protocol, PCI-Express (PCI-E) protocol, Advanced Technology Attachment (ATA) protocol, Serial-ATA protocol, Parallel-ATA protocol, Small Computer Small Interface (SCSI) protocol, Enhanced Small Disk Interface (ESDI) protocol, and Integrated Drive Electronics (IDE) protocol.

Figure 2:
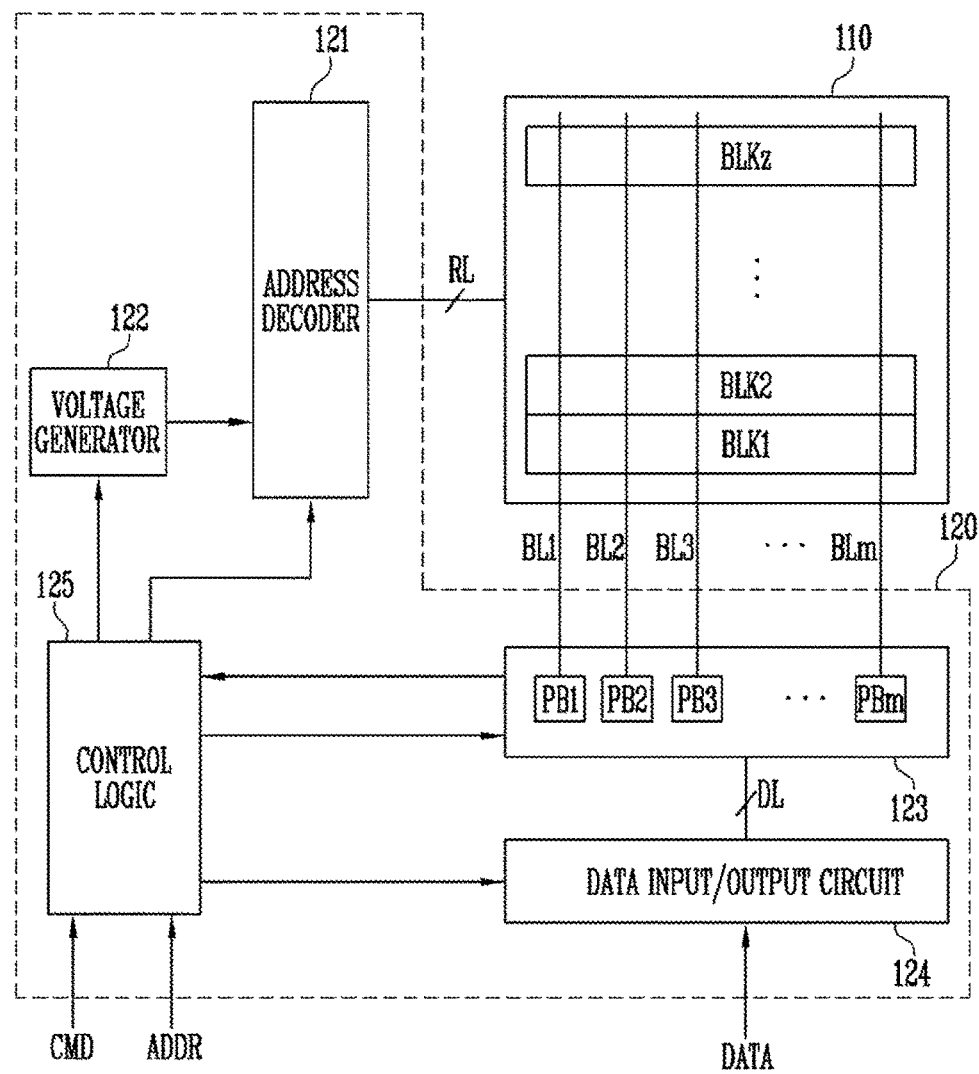
FIG. 2 is a block diagram illustrating a semiconductor memory device according to an embodiment.

FIG. 2 is a block diagram illustrating a semiconductor memory device according to an embodiment.

Figure 3:
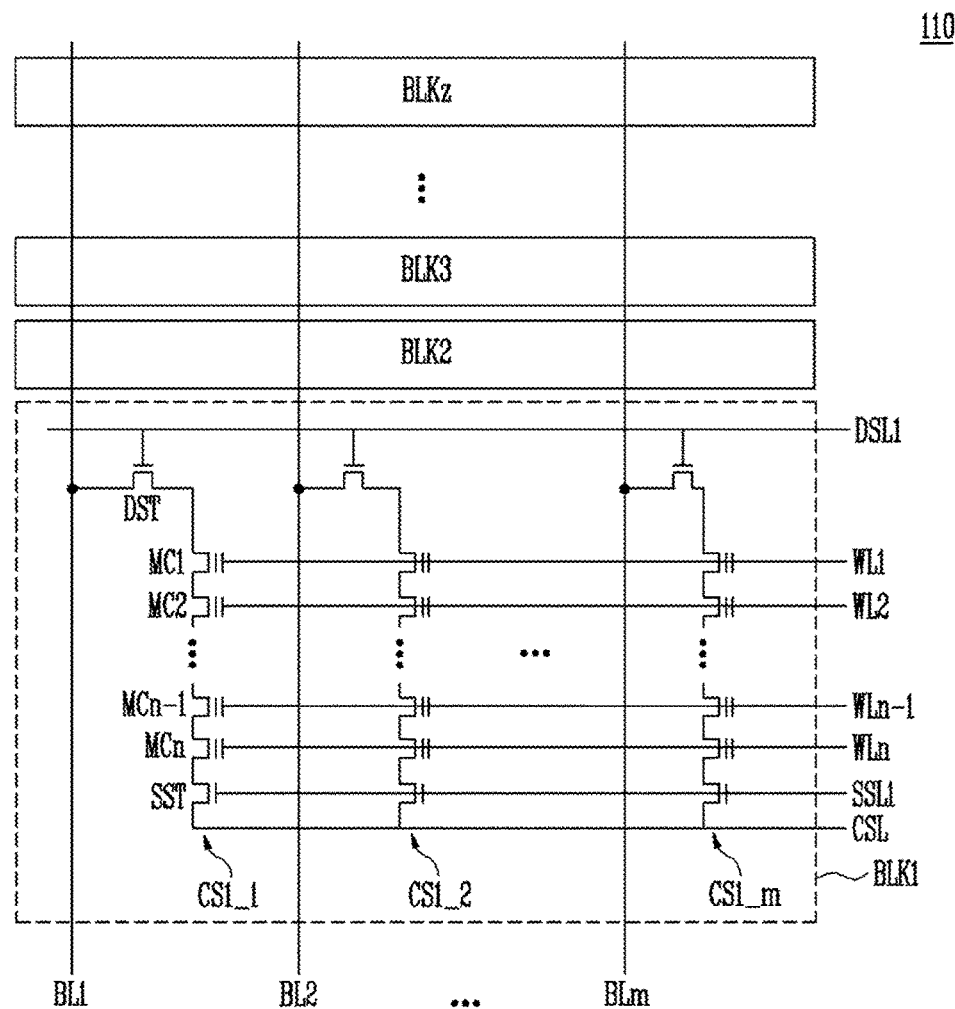
FIG. 3 is a diagram illustrating a memory cell array structure shown in FIG. 2.

FIG. 3 is a diagram illustrating a structure of the memory cell array 110 shown in FIG. 2.

Referring to FIG. 2, the semiconductor memory device 100 may include the memory cell array 110 and the peripheral circuit 120.

The memory cell array 110 may include a plurality of memory blocks BLK1 to BLKz. Each of the memory blocks BLK1 to BLKz may be coupled to an address decoder 121 through row lines RL and to a read and write circuit 123 through bit lines BL1 to BLm. Each of the memory blocks BLK1 to BLKz may include a plurality of memory cells. According to an embodiment, the plurality of memory cells may be nonvolatile memory cells.

The plurality of memory cells included in the memory cell array 110 may be divided into a plurality of blocks according to their purpose.

Referring to FIG. 3, the first to zth memory blocks BLK1 to BLKz may be commonly connected to the first to mth bit lines BL1 to BLm. In FIG. 3, for convenience of explanation, components included in the first memory block BLK1, among the plurality of memory blocks BLK1 to BLKz, are illustrated, and components included in the blocks BLK2 to BLKz may be omitted. It is to be understood that each of the memory blocks BLK2 to BLKz may have substantially the same configuration as the first memory block BLK1.

The memory block BLK1 may include a plurality of cell strings CS1_1 to CS1_$m$. The first to mth cell strings CS1_1 to CS1_$m$ may be coupled to the first to mth bit lines BL1 to BLm, respectively.

Each of the first to mth cell strings CS1_1 to CS1_$m$ may include a drain selection transistor DST, a plurality of memory cells MC1 to MCn coupled in series, and a source selection transistor SST. The drain selection transistor DST may be coupled to a drain selection line DSL1. The first to nth memory cells MC1 to MCn may be coupled to first to nth word lines WL1 to WLn, respectively. The source selection transistor SST may be coupled to a source selection line SSL1. A drain side of the drain selection transistor DST may be coupled to a corresponding bit line. Drain selection transistors of the first to mth cell strings CS1_1 to CS1_$m$ may be coupled to the first to mth bit lines BL1 to BLm, respectively. A source side of the source selection transistor SST may be coupled to the common source line CSL. According to an embodiment, the common source line CSL may be commonly connected to the first to zth memory blocks BLK1 to BLKz.

The drain selection line DSL1, the first to nth word lines WL1 to WLn, and the source selection line SSL1 may be included in the row lines RL shown in FIG. 2. The drain selection line DSL1, the first to nth word lines WL1 to WLn, and the source selection line SSL1 may be controlled by the address decoder 121. The common source line CSL may be controlled by a control logic 125. The first to mth bit lines BL1 to BLm may be controlled by the read and write circuit 123.

Referring again to FIG. 2, the peripheral circuit 120 may include the address decoder 121, a voltage generator 122, the read and write circuit 123, a data input/output circuit 124, and the control logic 125. The address decoder 121 may be coupled to the memory cell array 110 through the row lines RL. The address decoder 121 may be configured to operate in response to the control logic 125. The address decoder 121 may receive an address ADDR through the control logic 125.

According to an embodiment, a program operation and a read operation of the semiconductor memory device 100 may be performed in page units. During the program operation and the read operation, the address ADDR may include a block address and a row address. The address decoder 121 may be configured to decode the block address of the received address ADDR. The address decoder 121 may select one of the memory blocks BLK1 to BLKz according to the decoded block address. The address decoder 121 may be configured to decode the row address from the received address ADDR. The address decoder 121 may apply voltages provided from the voltage generator 122 to the row lines RL to select a single word line on the basis of the decoded row address.

During a program operation, the address decoder 121 may apply a program voltage to the selected word line and a pass voltage having a lower level than the program voltage to unselected word lines. During a program verify operation, the address decoder 121 may apply a verify voltage to the selected word line and a verify pass voltage greater than the verify voltage to the unselected word lines.

During a read operation, the address decoder 121 may apply a read voltage to the selected word line and the pass voltage greater than the read voltage to the unselected word lines.

According to an embodiment, the erase operation of the semiconductor memory device 100 may be performed in memory block units. During the erase operation, the address ADDR may include a block address. The address decoder 121 may decode the block address and select one memory block according to the decoded block address.

According to an embodiment, the address decoder 121 may include a block decoder, a word line decoder, and an address buffer.

The voltage generator 122 may be configured to generate a plurality of voltages by using an external power voltage supplied to the semiconductor memory device 100. The voltage generator 122 may operate in response to control of the control logic 125.

According to an embodiment, the voltage generator 122 may generate an internal power voltage by regulating an external power voltage. The internal power voltage generated by the voltage generator 122 may be used as an operating voltage of the semiconductor memory device 100.

According to an embodiment, the voltage generator 122 may generate a plurality of voltages by using the external power voltage or the internal power voltage. For example, the voltage generator 122 may include a plurality of pumping capacitors and generate a plurality of voltages by selectively activating the plurality of pumping capacitors in response to the control logic 125. The generated voltages may be applied to selected word lines by the address decoder 121.

The read and write circuit 123 may include first to mth page buffers PB1 to PBm. The first to mth page buffers PB1 to PBm may be coupled to the memory cell array 110 through the first to mth bit lines BL1 to BLm, respectively. The first to mth page buffers PB1 to PBm may operate in response to control of the control logic 125.

The first to mth page buffers PB1 to PBm may communicate data with the data input/output circuit 124. During a program operation, the first to mth page buffers PB1 to PBm may receive data DATA to be stored through the data input/output circuit 124 and the data lines DL.

During a program operation, when a program pulse is applied to a selected word line, the first to mth page buffers PB1 to PBm may transfer data DATA received through the data input/output circuit 124 to the selected memory cells through the bit lines BL1 to BLm. The memory cells of the selected page may be programmed according to the transferred data DATA. The read and write circuit 123 may apply a program permission voltage or a program inhibition voltage to bit lines BL1 to BLm coupled to selected memory cells. In one example, the control logic 125 may control the read and write circuit 123 to sequentially apply the program permission voltage and the program inhibition voltage to the bit lines BL1 to BLm coupled to selected memory cells when the program voltage is applied during, for example, a program operation. A memory cell coupled to a bit line to which a program permission voltage (e.g., a ground voltage) is applied may have an increased threshold voltage. A threshold voltage of a memory cell coupled to a bit line to which a program inhibition voltage (e.g., a power voltage) is applied may be maintained. During a program verify operation, the first to mth page buffers PB1 to PBm may read page data from the selected memory cells through the bit lines BL1 to BLm.

During a read operation, the read and write circuit 123 may read data DATA from the memory cells of the selected page through the bit lines BL and output the read data DATA to the data input/output circuit 124.

During an erase operation, the read and write circuit 123 may float the bit lines BL.

The data input/output circuit 124 may be coupled to the first to mth page buffers PB1 to PBm through the data lines DL. The data input/output circuit 124 may operate in response to control of the control logic 125. During a program operation, the data input/output circuit 124 may receive the data DATA to be stored from an external controller (not illustrated).

During a read operation, the data input/output circuit 124 may output the data transferred from the first to mth page buffers PB1 to PBm and included in the read and write circuit 123 to the external controller.

The control logic 125 may be coupled to the address decoder 121, the voltage generator 122, the read and write circuit 123, and the data input/output circuit 124. The control logic 125 may control general operations of the semiconductor memory device 100. The control logic 125 may receive a command CMD and an address ADDR from the external controller. The control logic 125 may be configured to control the address decoder 121, the voltage generator 122, the read and write circuit 123, and the data input/output circuit 124 in response to the command CMD. The control logic 125 may transfer the address ADDR to the address decoder 121.

The control logic 125 may control the address decoder 121, the voltage generator 122, and the read and write circuit 123 to perform a program operation. The control logic 125 may control the address decoder 121, the voltage generator 122, and the read and write circuit 123 so that necessary voltages to perform the program operation may be applied to the word lines and the bit lines during the program operation. Various embodiments of the voltages applied to the bit lines coupled to the memory cells during the program operation will be described in detail with reference to FIGS. 6 to 12 to be described below.

Figure 4:
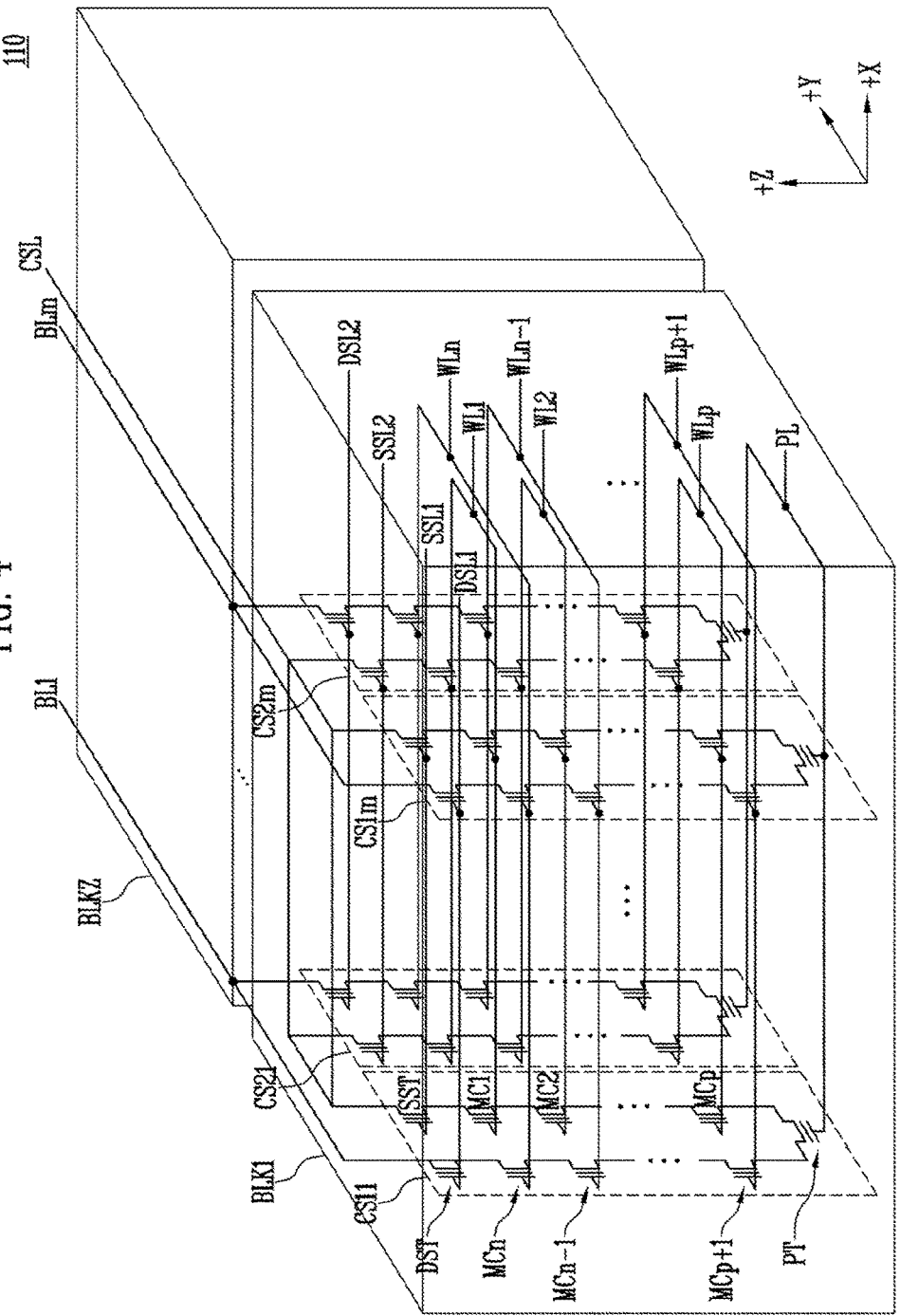
FIG. 4 is a diagram illustrating another embodiment of the memory cell array shown in FIG. 2.

FIG. 4 is a diagram illustrating another embodiment of the memory cell array 110 shown in FIG. 3.

Referring to FIG. 4, the memory cell array 110 may include a plurality of memory blocks BLK1 to BLKz. In FIG. 4, for convenience sake, the internal configuration of the first memory block BLK1 is illustrated, and the internal configuration of the remaining memory blocks BLK2 to BLKz is omitted. However, it is to be understood that the second to zth memory blocks BLK2 to BLKz have the same internal configuration as the first memory block BLK1.

Referring to FIG. 4, the first memory block BLK1 may include a plurality of cell strings CS11 to CS1*m* and CS21 to CS2*m*. According to an embodiment, each of the cell strings CS11 to CS1*m* and CS21 to CS2*m* may be formed into a U shape. In the first memory block BLK1, m cell strings may be arranged in a row direction (i.e., a +X direction). For convenience of explanation, FIG. 4 illustrates two cell strings arranged in a column direction (i.e., a +Y direction). However, it is to be understood that three or more cell strings may be arranged in the column direction.

Each of the cell strings CS11 to CS1*m* and CS21 to CS2*m* may include at least one source selection transistor SST, first to nth memory cells MC1 to MCn, a pipe transistor PT, and at least one drain selection transistor DST.

Each of the selection transistors SST and DST and each of the memory cells MC1 to MCn may have similar structures to each other. According to an embodiment, each of the selection transistors SST and DST and the memory cells MC1 to MCn may include a channel layer, a tunneling insulating layer, a charge storage layer, and a blocking insulating layer. According to an embodiment, a pillar for providing a channel layer may be provided to each cell string. According to an embodiment, a pillar for providing at least one of a channel layer, a tunneling insulating layer, a charge storage layer, and a blocking insulating layer may be provided to each cell string.

The source selection transistor SST of each cell string may be coupled between the common source line CSL and memory cells MC1 to MCp.

According to an embodiment, source selection transistors of cell strings arranged in the same row may be coupled to a source selection line extending in a row direction, and source selection transistors of cell strings arranged in different rows may be coupled to different source selection lines. In FIG. 4, the source selection transistors of the cell strings CS11 to CS1*m* in the first row may be coupled to the first source selection line SSL1. Source selection transistors of the cell strings CS21 to CS2*m* in the second row may be coupled to a second source selection line SSL2.

According to another embodiment, the source selection transistors of the cell strings CS11 to CS1*m* and CS21 to CS2*m* may be coupled in common to one source selection line.

The first to nth memory cells MC1 to MCn of each cell string may be coupled between the source selection transistor SST and the drain selection transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a reverse direction to the +Z direction and coupled in series between the source selection transistor SST and the pipe transistor PT. The (p+1)th to nth memory cells MCp+1 to MCn may be sequentially arranged in the +Z direction and coupled in series between the pipe transistor PT and the drain selection transistor DST. The first to pth memory cells MC1 to MCp and the (p+1)th to nth memory cells MCp+1 to MCn may be coupled through the pipe transistor PT. Gates of the first to nth memory cells MC1 to MCn of each cell string may be coupled to the first to nth word lines WL1 to WLn, respectively.

According to an embodiment, at least one of the first to nth memory cells MC1 to MCn may serve as a dummy memory cell. When the dummy memory cell is provided, a voltage or a current of the corresponding cell string may be stably controlled. Therefore, reliability of data stored in the memory block BLK1 may be improved.

A gate of the pipe transistor PT of each cell string may be coupled to a pipe line PL.

The drain selection transistor DST of each cell string may be coupled between a corresponding bit line and the memory cells MCp+1 to MCn. Cell strings arranged in the row direction may be coupled to a drain selection line extending in the row direction. The drain selection transistors of the cell strings CS11 to CS1*m* in the first row may be coupled to the first drain selection line DSL1. The drain selection transistors of the cell strings CS21 to CS2*m* in the second row may be coupled to a second drain selection line DSL2.

Cell strings arranged in the column direction may be coupled to a bit line extending in the column direction. In FIG. 4, the cell strings CS11 and CS21 in the first column may be coupled to the first bit line BL1. The cell strings CS1*m* and CS2*m* in the mth column may be coupled to the mth bit line BLm.

Memory cells coupled to the same word line in cell strings arranged in the row direction may form a single page. For example, memory cells coupled to the first word line WL1, among the cell strings CS11 to CS1*m* in the first row, may form a single page. Memory cells coupled to the first word line WL1 in the cell strings CS21 to CS2*m* in the second row may form another page. When one of the drain selection lines DSL1 and DSL2 is selected, cell strings arranged in one row direction may be selected. When one of the word lines WL1 to WLn is selected, one page may be selected from the selected cell strings.

Figure 5:
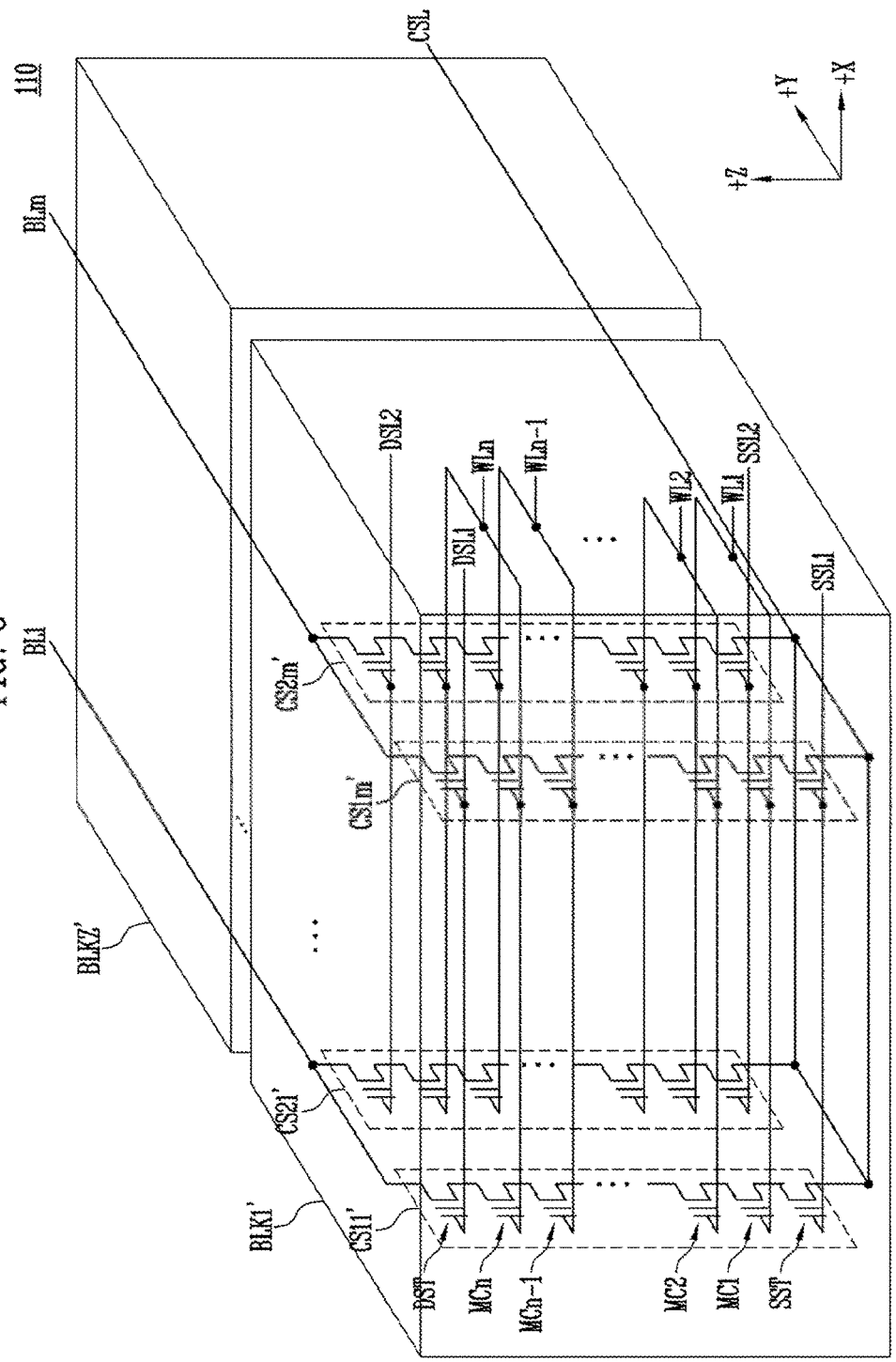
FIG. 5 is a diagram illustrating another embodiment of the memory cell array shown in FIG. 2.

FIG. 5 is a diagram illustrating another embodiment of the memory cell array 110 shown in FIG. 3.

Referring to FIG. 5, the memory cell array 110 may include a plurality of memory blocks BLK1' to BLKz'. For convenience sake, in FIG. 5, the internal configuration of the first memory block BLK1' is illustrated, and the internal configuration of the remaining memory blocks BLK2' to BLKz' is omitted. It is to be understood that second to zth memory blocks BLK2' to BLKz' may have the same configuration as the first memory block BLK1'.

The first memory block BLK1' may include a plurality of cell strings CS11' to CS1m' and CS21' to CS2m'. Each of the plurality of cell strings CS11' to CS1m' and CS21' to CS2m' may extend in the +Z direction. In the first memory block BLK1', m cell strings may be arranged in the +X direction. For convenience of explanation, FIG. 5 illustrates only two cell strings arranged in the +Y direction. It is to be understood that three or more cell strings may be arranged in the column direction.

Each of the cell strings CS11' to CS1m' and CS21' to CS2m' may include at least one source selection transistor SST, first to nth memory cells MC1 to MCn, and at least one drain selection transistor DST.

The source selection transistor SST of each cell string may be coupled between the common source line CSL and the memory cells MC1 to MCn. Source selection transistors of cell strings arranged in a same row may be coupled to the same source selection line. Source selection transistors of the cell strings CS11' to CS1m' arranged in the first row may be coupled to the first source selection line SSL1. Source selection transistors of the cell strings CS21' to CS2m' arranged in the second row may be coupled to the second source selection line SSL2. According to another embodiment, the source selection transistors of the cell strings CS11' to CS1m' and CS21' to CS2m' may be coupled in common to a single source selection line.

The first to nth memory cells MC1 to MCn of each cell string may be coupled in series between the source selection transistor SST and the drain selection transistor DST. Gates of the first to nth memory cells MC1 to MCn may be coupled to the first to nth word lines WL1 to WLn, respectively.

According to an embodiment, at least one of the first to nth memory cells MC1 to MCn may serve as a dummy memory cell. When a dummy memory cell is provided, a voltage or current of the corresponding cell string may be stably controlled. Therefore, reliability of data stored in the memory block BLK1' may be improved.

The drain selection transistor DST of each cell string may be coupled between a corresponding bit line and the memory cells MC1 to MCn. Drain selection transistors of cell strings arranged in the row direction may be coupled to a drain selection line extending in the row direction. Drain selection transistors of the cell strings CS11' to CS1m' in the first row may be coupled to the first drain selection line DSL1. Drain selection transistors of the cell strings CS21' to CS2m' in the second row may be coupled to the second drain selection line DSL2.

As a result, the memory block BLK1' shown in FIG. 5 may have an equivalent circuit similar to the memory block BLK1 shown in FIG. 4, except that the pipe transistor PT is removed from each cell string.

Figure 6:
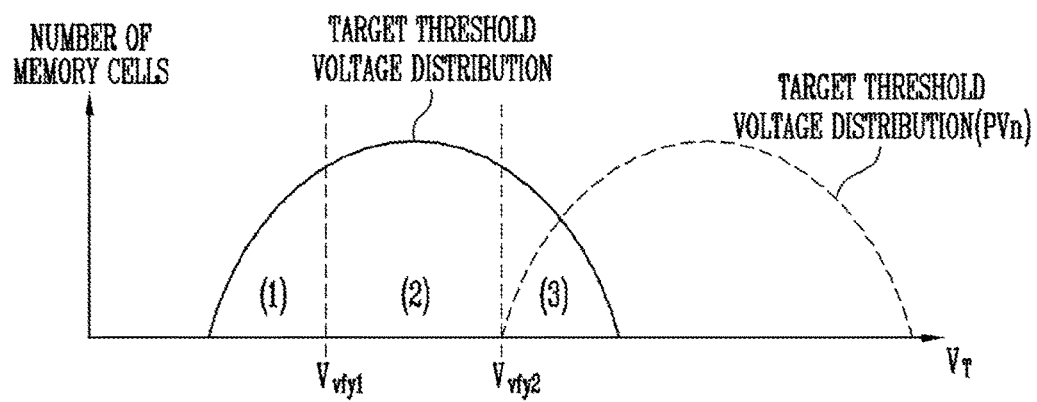
FIG. 6 is a diagram illustrating a program operation according to a double verify method.

FIG. 6 is a diagram illustrating a program operation according to a double verify method.

Before a program operation is performed, selected memory cells may have threshold voltages corresponding to an erase state ERASE. For example, a range of a threshold voltages corresponding to the erase state may be lower than that of a ground voltage. Selected memory cells of a semiconductor memory device may be programmed to have one of a plurality of program states. More specifically, the selected memory cells may be programmed to have a threshold voltage distribution having one of the first to nth program states PV1 to PVn.

A program operation to store data in a memory cell may be performed by carrying out a plurality of program loops. Each of the program loops may be divided into a program pulse apply operation to apply a program pulse to at least one selected word line and a program verify operation to verify a program state. In one example, the program state of selected memory cells may be verified by the first verify voltage and the second verify voltage greater than the first verify voltage before applying a program voltage to the selected word lines. According to an embodiment, a program operation may be performed by an incremental step pulse programming (ISPP) method by which a voltage of a program pulse is increased by a step voltage whenever a program loop is repeated.

In a program verify operation for selected memory cells, a double verify operation using two verify voltages for each program loop may be applied.

Referring to FIG. 6, it is assumed that selected memory cells have the nth program state PVn as a target program state. During a double verify operation, after a program pulse is applied to the selected memory cells, threshold voltages of the memory cells may be detected twice by using a second verify voltage Vvfy2 for the target program state and a first verify voltage Vvfy1 having a lower voltage level than the second verify voltage Vvfy2. As a result of detection, the memory cells may be divided into first memory cells (1) having threshold voltages lower than the first verify voltage Vvfy1, second memory cells (2) having threshold voltages greater than the first verify voltage Vvfy1 and lower than the second verify voltage Vvfy2, and third memory cells (3) having threshold voltages greater than the second verify voltage Vvfy2.

When a subsequent program loop is performed so that a program pulse is applied to a selected word line, a program permission voltage may be applied to bit lines coupled to the first memory cells (1). Threshold voltages of the first memory cells (1) may be increased as the program pulse is applied thereto. A program inhibition voltage may be applied to the bit lines coupled to the third memory cells (3). The threshold voltages of the third memory cells (3) may not be increased although the program pulse is applied thereto.

The threshold voltages of the second memory cells (2) may be higher than the first verify voltage Vvfy1 and lower than the second verify voltage Vvfy2. A program control voltage having a higher voltage level than the program permission voltage and a lower voltage level than the program inhibition voltage may be applied to bit lines coupled to the second memory cells (2) so as to reduce an increase in the threshold voltages of the second memory cells (2) when the program pulse is applied thereto. However, if a bit line voltage is not smoothly transferred due to a threshold voltage of the drain selection transistor DST of the cell string when the program control voltage is applied, the program inhibition voltage or the program permission voltage may be applied to the bit lines.

According to an embodiment, the semiconductor memory device may sequentially or randomly apply the program permission voltage and the program inhibition voltage to the bit lines coupled to the second memory cells (2) when the program pulse is applied to the word line. Therefore, by controlling the time during which a program is actually performed, a program operation may be stably performed regardless of the threshold voltage of the drain selection transistor.

Figure 7:
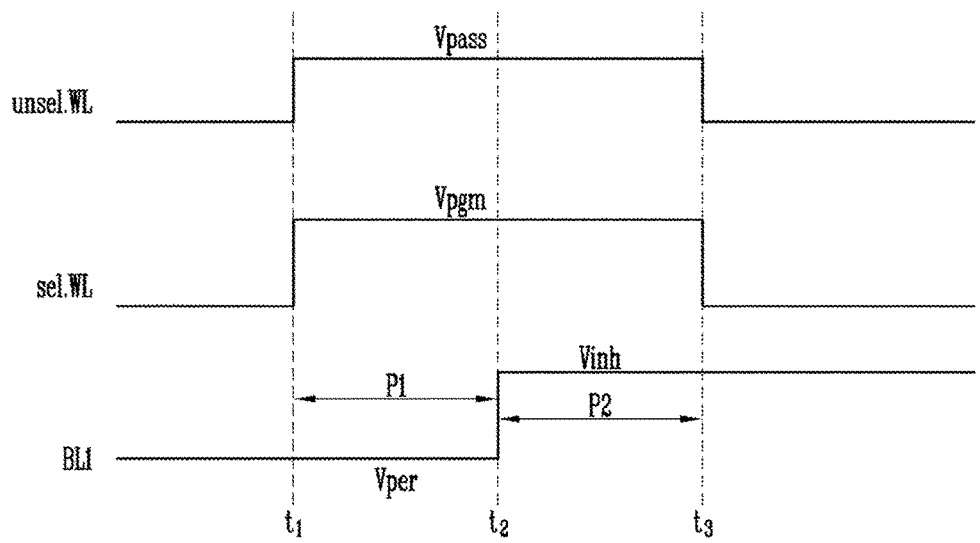
FIG. 7 is a diagram illustrating a method of operating a semiconductor memory device according to an embodiment.

FIG. 7 is a diagram illustrating a method of operating a semiconductor memory device according to an embodiment.

Referring to FIG. 7, a program voltage Vpgm may be applied to a selected word line sel.WL during a period t1 to t3, and a pass voltage Vpass having a lower voltage level than the program voltage Vpgm may be applied to unselected word lines unsel.WL during the period t1 to t3.

A program permission voltage may be applied to bit lines coupled to memory cells having threshold voltages lower than the first verify voltage. According to an embodiment, the program permission voltage may be a ground voltage GND.

A program inhibition voltage may be applied to bit lines coupled to memory cells having threshold voltages higher than a second verify voltage. According to an embodiment, the program inhibition voltage may be a power voltage Vcc.

A program permission voltage Vper and a program inhibition voltage Vinh may be sequentially applied to bit lines BL1 coupled to memory cells when in one example the program voltage Vpgm may be applied, where the memory cells may have threshold voltages higher than the first verify voltage and lower than the second verify voltage. More specifically, during the period t1 to t2 (P1), the control logic 125 may control the read and write circuit 123, described with reference to FIG. 2, of the semiconductor memory device which may apply the program permission voltage Vper to the bit lines BL1 coupled to memory cells having threshold voltages higher than the first verify voltage and lower than the second verify voltage. During a period t2 to t3 (P2), control logic 125 may control the read and write circuit 123 of the semiconductor memory device which may apply the program inhibition voltage Vinh to the bit lines BL1 coupled to memory cells having threshold voltages higher than the first verify voltage and lower than the second verify voltage. Therefore, the memory cells having threshold voltages higher than the first verify voltage and lower than the second verify voltage may be programmed during the period P1 and may not be programmed during the period P2. According to an embodiment, the program permission voltage applied to the bit lines BL1 coupled to memory cells having threshold voltages higher than the first verify voltage and lower than the second verify voltage may be a positive voltage greater than 0V. According to an embodiment, the program inhibition voltage, applied to the bit lines BL1 coupled to memory cells having threshold voltages higher than the first verify voltage and lower than the second verify voltage, may be a positive voltage lower than the power voltage Vcc.

According to an embodiment, the duration of each of the period P1 and the period P2 may be substantially the same and may be half the duration of the entire period during which the program voltage Vpgm is applied to the selected word line.

Figure 8:
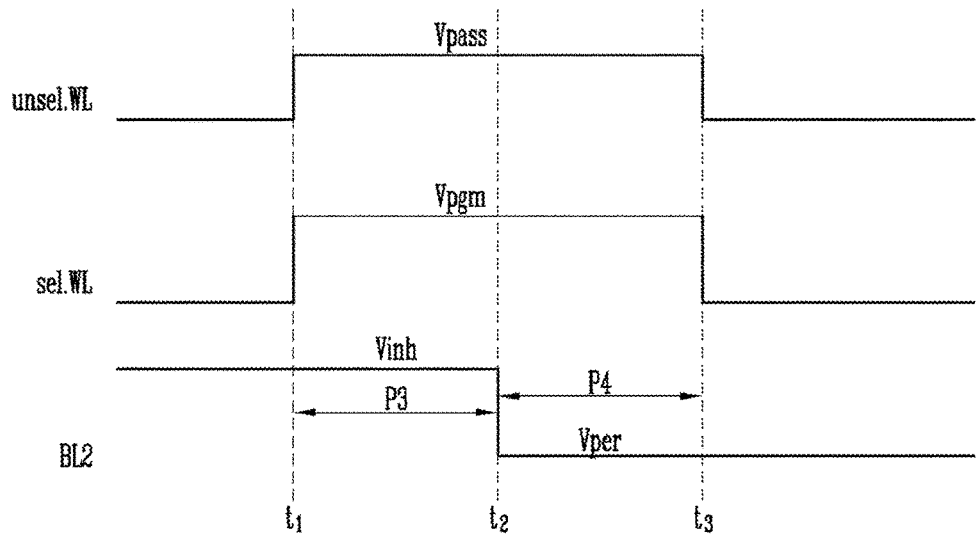
FIG. 8 is a diagram illustrating a method of operating a semiconductor memory device according to another embodiment.

FIG. 8 is a diagram illustrating a method of operating a semiconductor memory device according to another embodiment.

Referring to FIG. 8, the program voltage Vpgm may be applied to the selected word line sel.WL during a period t1 to t3, and the pass voltage Vpass having a lower voltage level than the program voltage Vpgm may be applied to the unselected word lines unsel.WL during the period t1 to t3.

A program permission voltage may be applied to bit lines coupled to memory cells having threshold voltages lower than a first verify voltage. According to an embodiment, the program permission voltage may be the ground voltage GND.

A program inhibition voltage may be applied to bit lines coupled to memory cells having threshold voltages higher than a second verify voltage. According to an embodiment, the program inhibition voltage may be the power voltage Vcc.

The program inhibition voltage Vinh and the program permission voltage Vper may be sequentially applied to bit lines BL2 coupled to memory cells when in one example the program voltage Vpgm is applied, where the memory cells may have threshold voltages higher than the first verify voltage and lower than the second verify voltage. More specifically, the control logic 125 may control the read and write circuit 123 of the semiconductor memory device which may apply the program inhibition voltage Vinh to the bit lines BL2 coupled to memory cells having threshold voltages higher than the first verify voltage and lower than the second verify voltage during a period t1 to t2 (P3). The control logic 125 may control the read and write circuit 123 of the semiconductor memory device may apply the program permission voltage Vper to the bit lines BL2 coupled to memory cells having threshold voltages higher than the first verify voltage and lower than the second verify voltage during a period t2 to t3 (P4). Therefore, the memory cells having threshold voltages higher than the first verify voltage and lower than the second verify voltage may be programmed during the period P4 and may not be programmed during the period P3. According to an embodiment, the program permission voltage applied to the bit lines BL2 coupled to memory cells having threshold voltages higher than the first verify voltage and lower than the second verify voltage may be a positive voltage greater than 0V. According to an embodiment, the program inhibition voltage applied to the bit lines BL2 coupled to memory cells having threshold voltages higher than the first verify voltage and lower than the second verify voltage may be a positive voltage lower than the power voltage Vcc.

According to an embodiment, the duration of each of the periods P3 and P4 may be substantially the same and may be half the duration of the entire period during which the program voltage Vpgm is applied to the selected word line.

Figure 9:
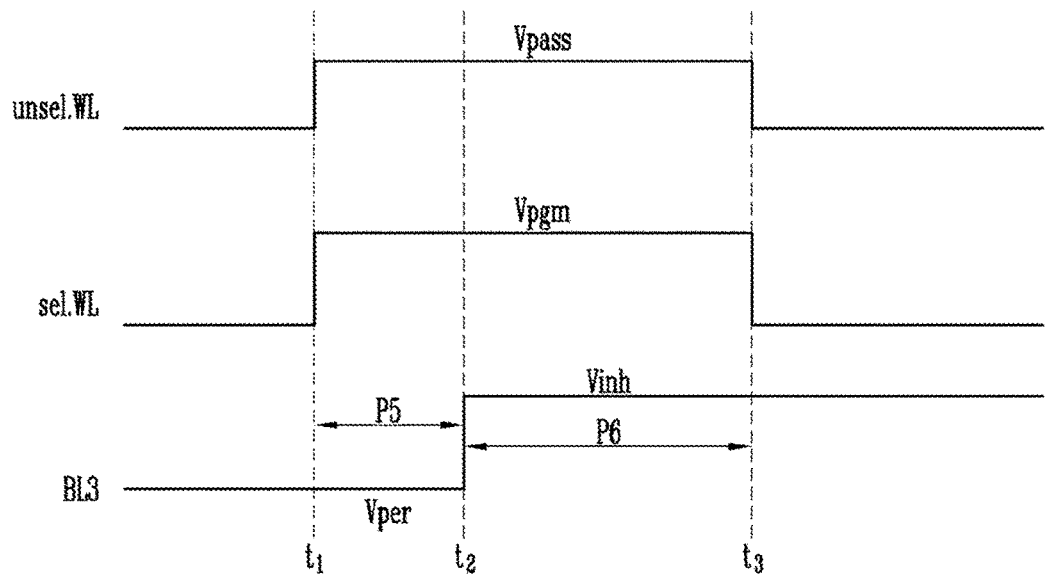
FIG. 9 is a diagram illustrating a method of operating a semiconductor memory device according to another embodiment.

FIG. 9 is a diagram illustrating a method of operating a semiconductor memory device according to another embodiment.

Referring to FIG. 9, the program voltage Vpgm may be applied to the selected word line sel.WL during a period t1 to t3 and the pass voltage Vpass having a lower voltage level than the program voltage Vpgm may be applied to the unselected word lines unsel.WL during the period t1 to t3.

A program permission voltage may be applied to bit lines coupled to memory cells having threshold voltages lower than a first verify voltage. According to an embodiment, the program permission voltage may be the ground voltage GND.

A program inhibition voltage may be applied to bit lines coupled to memory cells having threshold voltages greater than a second verify voltage. According to an embodiment, the program inhibition voltage may be the power voltage Vcc.

The program permission voltage Vper and the program inhibition voltage Vinh may be sequentially applied to bit lines BL3 coupled to memory cells when in one example the program voltage Vpgm is applied, where the memory cells may have threshold voltages higher than the first verify voltage and lower than the second verify voltage. More specifically, the control logic 125 may control the read and write circuit 123 of the semiconductor memory device may apply the program permission voltage Vper to the bit lines BL3 coupled to memory cells having threshold voltages higher than the first verify voltage and lower than the second verify voltage during a period t1 to t2 (P5). The control logic 125 may control the read and write circuit 123 of the semiconductor memory device which may apply the program inhibition voltage Vinh to the bit lines BL3 coupled to memory cells having threshold voltages higher than the first verify voltage and lower than the second verify voltage during a period t2 to t3 (P6). Therefore, the memory cells having threshold voltages higher than the first verify voltage and lower than the second verify voltage may be programmed during the period P5 and may not be programmed during the period P6. According to an embodiment, the program permission voltage applied to the bit lines BL3 coupled to memory cells having threshold voltages higher than the first verify voltage and lower than the second verify voltage may be a positive voltage greater than 0V. According to an embodiment, the program inhibition voltage applied to the bit lines BL3 coupled to memory cells having threshold voltages higher than the first verify voltage and lower than the second verify voltage may be a positive voltage lower than the power voltage Vcc. Compared to the embodiment shown in FIG. 7, the period P5 may be shorter than the period P6 according to the embodiment shown in FIG. 9.

According to an embodiment, durations of the periods P5 and P6 may differ and may vary depending on threshold voltages of memory cells. More specifically, memory cells having threshold voltages closer to a lower verify voltage between the first verify voltage and the second verify voltage may result in an increase in the period P5 and a decrease in the period P6. Alternatively, memory cells having threshold voltages closer to a higher verify voltage between the first verify voltage and the second verify voltage may result in an increase in the period P6 and a decrease in the period P5.

According to an embodiment, the durations of the periods P5 and P6 may differ and may vary depending on the location of the selected word line. More specifically, the durations of the period P5 and the period P6 may vary depending on a distance between a selected word line and the address decoder 121 described with reference to FIG. 2. For example, the semiconductor memory device may increase the period P5 and decrease the period P6 when performing a program operation on a word line distant from the address decoder 121. Or, the semiconductor memory device may increase the period P6 and decrease the period P5 when performing a program operation on a word line close to the address decoder 121. Alternatively, the semiconductor memory device may increase the period P6 and decrease the period P5 when performing a program operation on a word line distant from the address decoder 121. Or, the semiconductor memory device may increase the period P5 and decrease the period P6 when performing a program operation on a word line close to the address decoder 121.

Figure 10:
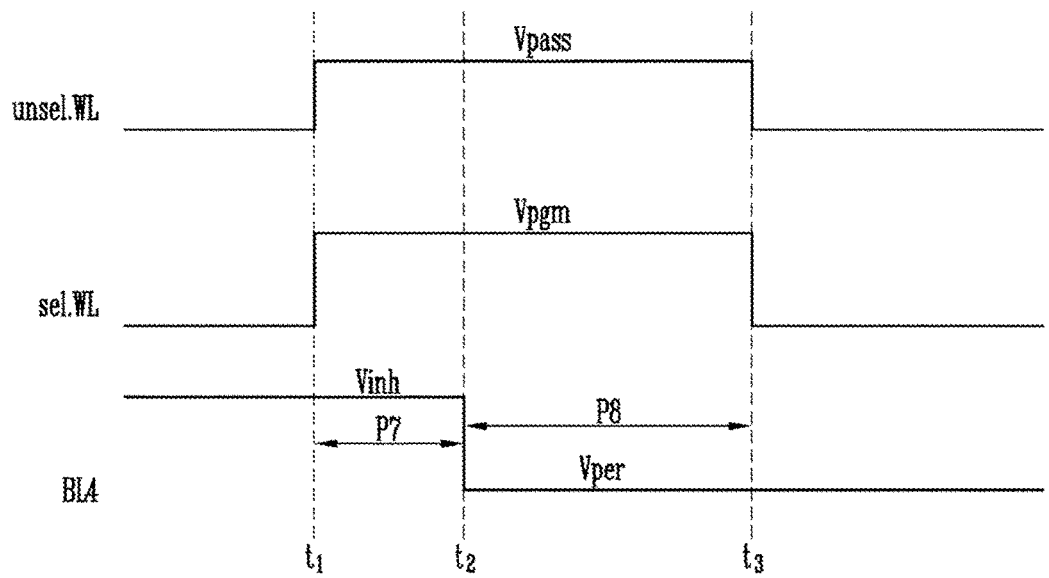
FIG. 10 is a diagram illustrating a method of operating a semiconductor memory device according to another embodiment.

FIG. 10 is a diagram illustrating a method of operating a semiconductor memory device according to another embodiment.

Referring to FIG. 10, the program voltage Vpgm may be applied to a selected word line sel.WL during a period t1 to t3, and the pass voltage Vpass having a lower voltage level than the program voltage Vpgm may be applied to unselected word lines unsel.WL during the period t1 to t3.

A program permission voltage may be applied to bit lines coupled to memory cells having threshold voltages lower than a first verify voltage. According to an embodiment, the program permission voltage may be the ground voltage GND.

A program inhibition voltage may be applied to bit lines coupled to memory cells having threshold voltages greater than the second verify voltage. According to an embodiment, the program inhibition voltage may be the power voltage Vcc.

The program inhibition voltage Vinh and the program permission voltage Vper may be sequentially applied to bit lines BL4 coupled to memory cells when in one example the program voltage Vpgm is applied, where the memory cells may have threshold voltages greater than the first verify voltage and lower than the second verify voltage. More specifically, the control logic 125 may control the read and write circuit 123 of the semiconductor memory device which may apply the program inhibition voltage Vinh to the bit lines BL4 coupled to memory cells having threshold voltages greater than the first verify voltage and lower than the second verify voltage during a period t1 to t2 (P7). The control logic 125 may control the read and write circuit 123 of the semiconductor memory device which may apply the program permission voltage Vper to the bit lines BL4 coupled to memory cells having threshold voltages greater than the first verify voltage and lower than the second verify voltage during a period t2 to t3 (P8). Therefore, the bit lines BL4 coupled to memory cells having threshold voltages greater than the first verify voltage and lower than the second verify voltage may be programmed during the period P8 and may not be programmed during the period P7. According to an embodiment, the program permission voltage applied to the bit lines BL4 coupled to memory cells having threshold voltages greater than the first verify voltage and lower than the second verify voltage may be a positive voltage greater than 0V. According to an embodiment, the program inhibition voltage applied to the bit lines BL4 coupled to memory cells having threshold voltages greater than the first verify voltage and lower than the second verify voltage may be a positive voltage lower than the power voltage Vcc. Compared to the embodiment shown in FIG. 8, the period P7 may be shorter than the period P8 in the embodiment shown in FIG. 10.

According to an embodiment, durations of the periods P7 and P8 may differ and may vary depending on threshold voltages of memory cells. More specifically, memory cells having threshold voltages closer to a lower verify voltage between the first verify voltage and the second verify voltage may increase the period P8 and decrease the period P7. Alternatively, memory cells having threshold voltages closer to a higher verify voltage between the first verify voltage and the second verify voltage may increase the period P7 and decrease the period P8.

According to an embodiment, the duration of each of the periods P7 and P8 may differ and may vary depending on the location of the selected word line. More specifically, the durations of the periods P7 and P8 may vary depending on a distance between a selected word line and the address decoder 121 described with reference to FIG. 2. For example, the semiconductor memory device may increase the period P7 and decrease the period P8 when performing a program operation on a word line distant from the address decoder 121. Or, the semiconductor memory device may increase the period P8 and decrease the period P7 when performing a program operation on a word line close to the address decoder 121. Alternatively, the semiconductor memory device may increase the period P8 and decrease the period P7 when performing a program operation on a word line distant from the address decoder 121. Or, the semiconductor memory device may increase the period P7 and decrease the period P8 when performing a program operation on a word line close to the address decoder 121.

Figure 11:
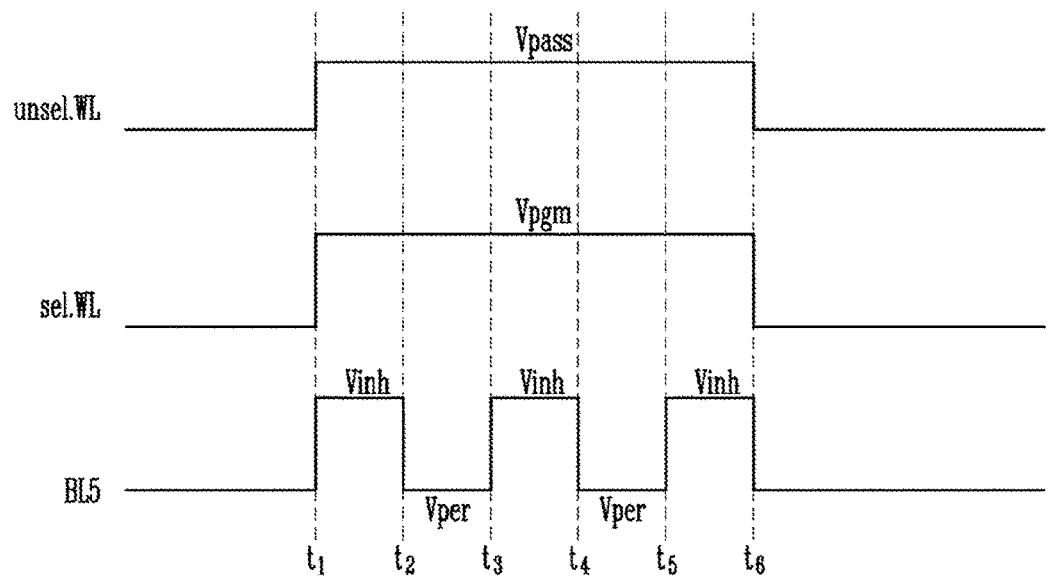
FIG. 11 is a diagram illustrating a method of operating a semiconductor memory device according to another embodiment.

FIG. 11 is a diagram illustrating a method of operating a semiconductor memory device according to another embodiment.

Referring to FIG. 11, the program voltage Vpgm may be applied to the selected word line sel.WL during a period t1 to t6 and the pass voltage Vpass having a lower voltage level than the program voltage Vpgm may be applied to the unselected word lines unsel.WL during the period t1 to t6.

A program permission voltage may be applied to bit lines coupled to memory cells having threshold voltages lower than a first verify voltage. According to an embodiment, the program permission voltage may be the ground voltage GND.

A program inhibition voltage may be applied to bit lines coupled to memory cells having threshold voltages greater than a second verify voltage. According to an embodiment, the program inhibition voltage may be the power voltage Vcc.

The program inhibition voltage Vinh and the program permission voltage Vper may be sequentially applied to bit lines BL5 coupled to memory cells when in one example the program voltage Vpgm is applied, where the memory cells may have threshold voltages higher than the first verify voltage and lower than the second verify voltage. According to an embodiment, the program inhibition voltage Vinh and the program permission voltage Vper may be repeatedly applied to the bit lines BL5 coupled to memory cells having threshold voltages higher than the first verify voltage and lower than the second verify voltage. More specifically, the control logic 125 may control the read and write circuit 123 of the semiconductor memory device which may apply the program inhibition voltage Vinh during periods t1 to t2, t3 to t4, and t5 to t6 and may apply the program permission voltage Vper during periods t2 to t3 and t4 to t5.

Memory cells having threshold voltages higher than the first verify voltage and lower than the second verify voltage may be programmed during the periods t2 to t3 and t4 to t5 in which the program permission voltage Vper is applied, and may not be programmed during the periods t1 to t2, t3 to t4, and t5 to t6 in which the program inhibition voltage Vinh is applied. According to an embodiment, the program permission voltage applied to the bit lines BL5 coupled to memory cells having threshold voltages higher than the first verify voltage and lower than the second verify voltage may be a positive voltage greater than 0V. According to an embodiment, the program inhibition voltage applied to the bit lines BL5 coupled to memory cells having threshold voltages higher than the first verify voltage and lower than the second verify voltage may be a positive voltage lower than the power voltage Vcc.

According to an embodiment, the number of times and durations which the program inhibition voltage Vinh and the program permission voltage Vper are applied may vary. For example, the number of times the program inhibition voltage Vinh is applied may be greater than or smaller than the number of times the program permission voltage Vper is applied. More specifically, memory cells having threshold voltages closer to a lower verify voltage between the first verify voltage and the second verify voltage may result in an increase in the number of times or the duration which the program permission voltage Vper is applied. Memory cells with threshold voltages having a higher verify voltage between the first verify voltage and the second verify voltage may result in an increase in the number of times and the duration which the program inhibition voltage Vinh is applied.

As illustrated in FIG. 11, the program inhibition voltage Vinh may be applied before the program permission voltage Vper by, for example, the control logic 125. However, according to another embodiment, the program permission voltage Vper may be applied before the program inhibition voltage Vinh by for example, the control logic 125.

Figure 12:
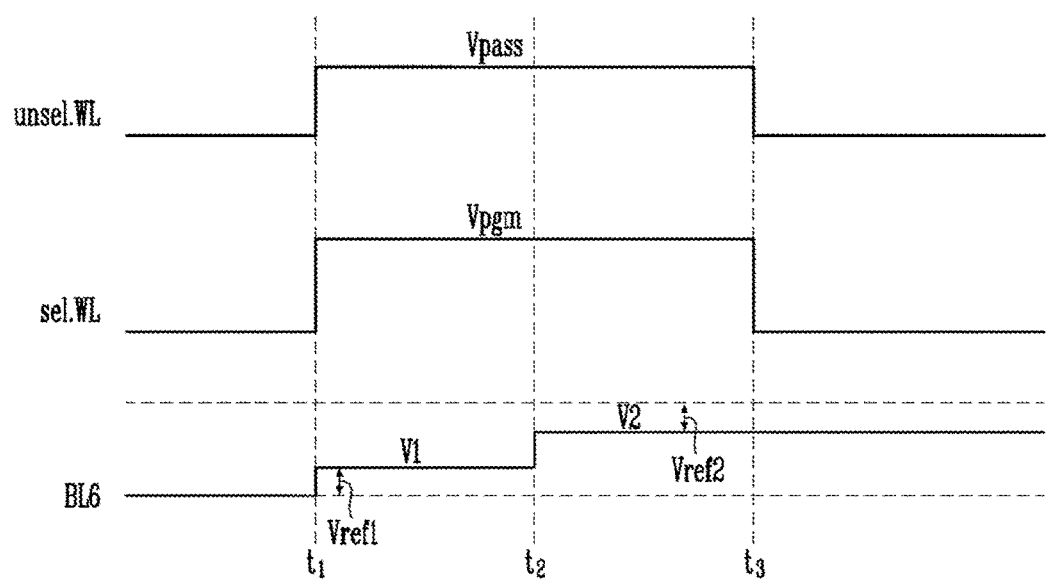
FIG. 12 is a diagram illustrating a method of operating a semiconductor memory device according to another embodiment.

FIG. 12 is a diagram illustrating a method of operating a semiconductor memory device according to another embodiment.

Referring to FIG. 12, the program voltage Vpgm may be applied to the selected word line sel.WL during a period t1 to t3 and the pass voltage Vpass having a lower voltage level than the program voltage Vpgm may be applied to the unselected word lines unsel.WL during the period t1 to t3.

A program permission voltage may be applied to bit lines coupled to memory cells having threshold voltages lower than a first verify voltage. According to an embodiment, the program permission voltage may be the ground voltage GND.

A program inhibition voltage may be applied to bit lines coupled to memory cells having threshold voltages greater than a second verify voltage. According to an embodiment, the program inhibition voltage may be the power voltage Vcc.

A first voltage V1 and a second voltage V2 may be sequentially applied to bit lines BL6 coupled to memory cells when in one example the program voltage Vpgm is applied, where the memory cells may have threshold voltages higher than a first verify voltage and lower than a second verify voltage. More specifically, the control logic 125 may control the read and write circuit 123 of the semiconductor memory device which may sequentially apply the first voltage V1 to the bit lines BL6 coupled to memory cells having threshold voltages higher than the first verify voltage and lower than the second verify voltage during a period t1 to t2. The control logic 125 may control the read and write circuit 123 of semiconductor memory device which may apply the second voltage V2 to the bit lines BL6 coupled to memory cells having threshold voltages higher than the first verify voltage and lower than the second verify voltage during a period t2 to t3. The memory cells having threshold voltages higher than the first verify voltage and lower than the second verify voltage may be programmed during the period (t1 to t2) in which the first voltage V1 is applied, and may not be programmed during the period in which the second voltage V2 is applied. According to an embodiment, the first voltage V1 may be a positive voltage having a higher voltage level than a ground voltage (0V) by a first reference value Vref1. The second voltage V2 may be a positive voltage having a lower voltage level than the power voltage Vcc by a second reference value Vref2.

Figure 13:
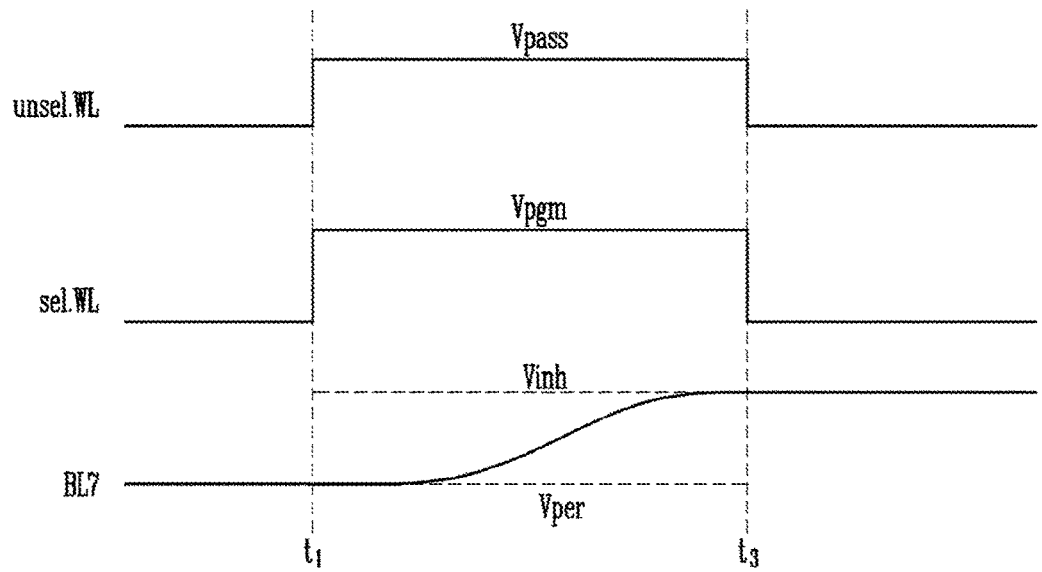
FIG. 13 is a diagram illustrating a method of operating a semiconductor memory device according to another embodiment.

FIG. 13 is a diagram illustrating a method of operating a semiconductor memory device according to another embodiment.

Referring to FIG. 13, a program voltage Vpgm may be applied to a selected word line sel.WL during a period t1 to t3, and a pass voltage Vpass having a lower voltage level than the program voltage Vpgm may be applied to unselected word lines unsel.WL during the period t1 to t3.

A program permission voltage may be applied to bit lines coupled to memory cells having threshold voltages lower than the first verify voltage. According to an embodiment, the program permission voltage may be a ground voltage GND.

A program inhibition voltage may be applied to bit lines coupled to memory cells having threshold voltages higher than a second verify voltage. According to an embodiment, the program inhibition voltage may be a power voltage Vcc.

A bit line voltage having a voltage level increasing from a program permission voltage Vper to a program inhibition voltage Vinh may be applied to bit lines BL7 coupled to memory cells when in one example the program voltage Vpgm may be applied, where the memory cells may have threshold voltages higher than the first verify voltage and lower than the second verify voltage. More specifically, during the period t1 to t3, the control logic 125 may control the read and write circuit 123, described with reference to FIG. 2, of the semiconductor memory device which may apply the bit line voltage having a voltage level increasing continuously from the program permission voltage Vper to the program inhibition voltage Vinh during the period t1 to t3 to the bit lines BL7 coupled to memory cells having threshold voltages higher than the first verify voltage and lower than the second verify voltage.

According to an embodiment, the program permission voltage applied to the bit lines BL7 coupled to memory cells having threshold voltages higher than the first verify voltage and lower than the second verify voltage may be a positive voltage greater than 0V. According to an embodiment, the program inhibition voltage, applied to the bit lines BL7 coupled to memory cells having threshold voltages higher than the first verify voltage and lower than the second verify voltage, may be a positive voltage lower than the power voltage Vcc.

According to an embodiment, the duration of the period t1 to t3 and bit line voltage applied to the bit lines BL7 can be controlled to perform the program operation stably regardless of the threshold voltage of the drain selection transistor.

Figure 14:
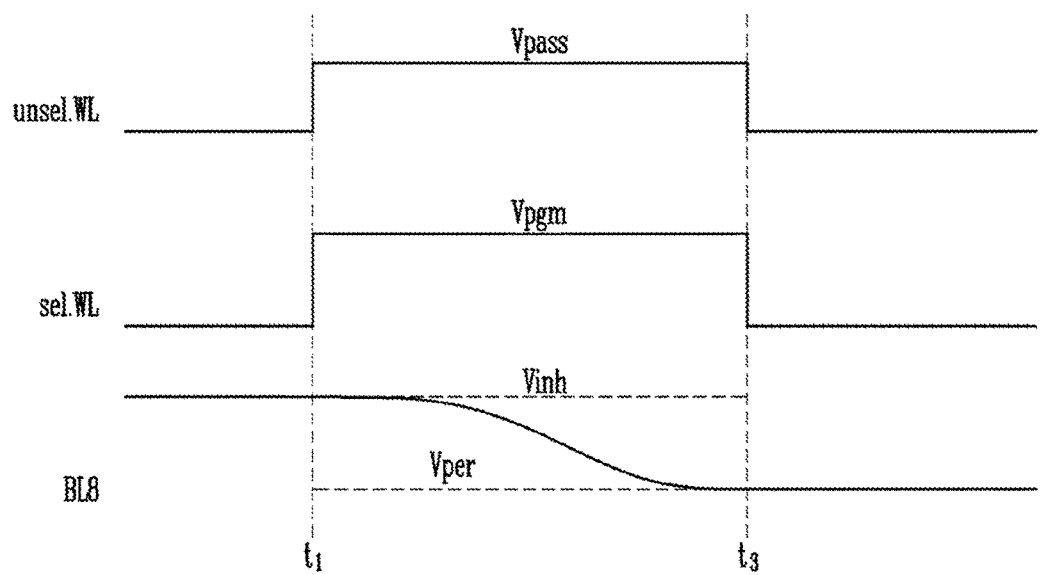
FIG. 14 is a diagram illustrating a method of operating a semiconductor memory device according to another embodiment.

FIG. 14 is a diagram illustrating a method of operating a semiconductor memory device according to another embodiment.

Referring to FIG. 14, a program voltage Vpgm may be applied to a selected word line sel.WL during a period t1 to t3, and a pass voltage Vpass having a lower voltage level than the program voltage Vpgm may be applied to unselected word lines unsel.WL during the period t1 to t3.

A program permission voltage may be applied to bit lines coupled to memory cells having threshold voltages lower than the first verify voltage. According to an embodiment, the program permission voltage may be a ground voltage GND.

A program inhibition voltage may be applied to bit lines coupled to memory cells having threshold voltages higher than a second verify voltage. According to an embodiment, the program inhibition voltage may be a power voltage Vcc.

A bit line voltage having a voltage level decreasing from a program inhibition voltage Vinh to a program permission voltage Vper may be applied to bit lines BL8 coupled to memory cells when in one example the program voltage Vpgm may be applied, where the memory cells may have threshold voltages higher than the first verify voltage and lower than the second verify voltage. More specifically, during the period t1 to t3, the control logic 125 may control the read and write circuit 123, described with reference to FIG. 2, of the semiconductor memory device which may apply the bit line voltage having a voltage level continuously decreasing from the program inhibition voltage Vinh to the program permission voltage Vper during the period t1 to t3 to the bit lines BL8 coupled to memory cells having threshold voltages higher than the first verify voltage and lower than the second verify voltage.

According to an embodiment, the program permission voltage applied to the bit lines BL8 coupled to memory cells having threshold voltages higher than the first verify voltage and lower than the second verify voltage may be a positive voltage greater than 0V. According to an embodiment, the program inhibition voltage, applied to the bit lines BL8 coupled to memory cells having threshold voltages higher than the first verify voltage and lower than the second verify voltage, may be a positive voltage lower than the power voltage Vcc.

According to an embodiment, the duration of the period t1 to t3 and the bit line voltage applied to the bit lines BL8 can be controlled to perform the program operation stably regardless of the threshold voltage of the drain selection transistor. The voltages applied to the bit lines BL1 to BL6 described with reference to FIGS. 7 to 14 may not be applied in all first to nth program states PV1 to PVn, but may be applied during program operations for some of the program states. More specifically, the voltages applied to the bit lines BL1 to BL6 described with reference to FIGS. 7 to 14 may be applied to bit lines coupled to memory cells higher than the first verify voltage and lower than the second verify voltage during only a program operation with respect to a predetermined program state. The predetermined program state may be at least one of the program states. According to an embodiment, the semiconductor memory device may apply the voltages to the bit lines BL1 to BL6 during only a program operation with respect to high program states (PV4 to PVn), but not during a program operation with respect to low program states (PV1 to PV3).

According to various embodiments, the voltages applied to the bit lines BL1 to BL6 described with reference to FIGS. 7 to 14 may be applied to a program operation in which three or more verify operations are performed or one verify operation is used, as well as a program operation using a double verify operation.

Figure 15:
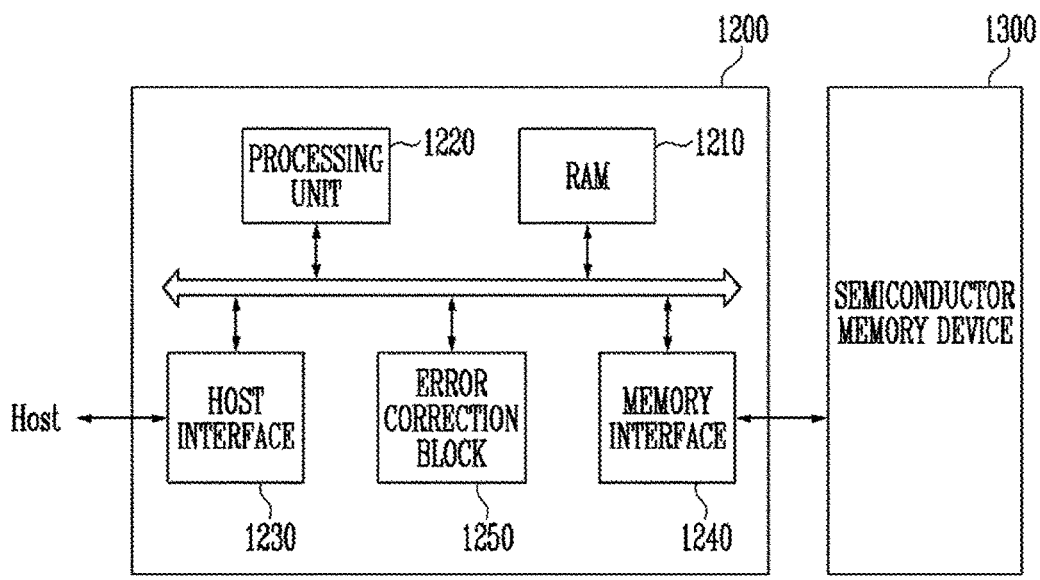
FIG. 15 is a block diagram illustrating a memory system including a semiconductor memory device shown in FIG. 2.

FIG. 15 is a block diagram illustrating a memory system 1000 including the semiconductor memory device shown in FIG. 2.

Referring to FIG. 15, the memory system 1000 may include the semiconductor memory device 1300 and a controller 1200.

The semiconductor memory device 1300 may be configured and operated in substantially the same manner as the semiconductor memory device 100 described above with reference to FIG. 2. Thus, a detailed description thereof will be omitted.

The controller 1200 may be coupled to a host and the semiconductor memory device 1300. The controller 1200 may access the semiconductor memory device 1300 at the request of the host. For example, the controller 1200 may control a read operation, a program operation, an erase operation, and/or a background operation of the semiconductor memory device 1300. The controller 1200 may provide an interface between the semiconductor memory device 1300 and the host. The controller 1200 may drive firmware for controlling the semiconductor memory device 1300.

The controller 1200 may include a random access memory (RAM) 1210, a processing unit 1220, a host interface 1230, a memory interface 1240, and an error correction block 1250.

The RAM 1210 may be used as operation memory of the processing unit 1220, a cache memory between the semiconductor memory device 1300 and the host, and/or a buffer memory between the semiconductor memory device 1300 and the host.

The processing unit 1220 may control operations of the controller 1200.

The processing unit 1220 may be configured to randomize data received from the host. For example, the processing unit 1220 may randomize data received from the host by using a randomizing seed. The randomized data may be provided as data DATA to be stored as shown in FIG. 1 to the semiconductor memory device 1300 and programmed in the memory cell array 110 shown in FIG. 1.

The processing unit 1220 may be configured to derandomize data received from the semiconductor memory device 1300. For example, the processing unit 1220 may derandomize data received from the semiconductor memory device 1300 by using a derandomizing seed. The derandomized data may be output to the host.

According to an embodiment, the processing unit 1220 may randomize or derandomize data by driving software or firmware.

The host interface 1230 may include a protocol for exchanging data between the host and the controller 1200. For example, the controller 1200 may communicate with the host through one or more various protocols such as a universal serial bus (USB) protocol, a multimedia card (MMC) protocol, a peripheral component interconnection (PCI) protocol, a PCI-express (PCI-E) protocol, an advanced technology attachment (ATA) protocol, a serial-ATA protocol, a parallel-ATA protocol, a small computer small interface (SCSI) protocol, an enhanced small disk interface (ESDI) protocol, an integrated drive electronics (IDE) protocol, a private protocol, etc.

The memory interface 1240 may interface with the semiconductor memory device 1300. For example, the memory interface may include a NAND flash interface or a NOR flash interface.

The error correction block 1250 may detect and correct errors in data read from the semiconductor memory device 1300 by using an error correction code (ECC).

The controller 1200 and the semiconductor memory device 1300 may be integrated in one semiconductor device. According to an embodiment, the controller 1200 and the semiconductor memory device 1300 may be integrated in a single semiconductor device to form a memory card such as a PC card (personal computer memory card international association (PCMCIA)), a compact flash card (CF), a smart media card (SMC), a memory stick, a multimedia card (MMC, RS-MMC or MMCmicro), an SD card (SD, miniSD, micro SD or SDHC), a universal flash storage device (UFS), etc.

The controller 1200 and the semiconductor memory device 1300 may be integrated in a single semiconductor device to form a solid state drive (SSD). The SSD may include a storage device for storing data in a semiconductor memory device. When the memory system 1000 is used as an SSD, operational rates of the host coupled to the memory system 1000 may be significantly improved.

In another example, the memory system 1000 may be used as one of several elements in various electronic devices such as a computer, an ultra mobile PC (UMPC), a workstation, a net-book, a personal digital assistant (PDA), a portable computer, a web table, a wireless phone, a mobile phone, a smart phone, an e-book, a portable multimedia player (PMP), a portable game machine, a navigation device, a black box, a digital camera, a three-dimensional television, a digital audio recorder, a digital audio player, a digital picture recorder, a digital picture player, a digital video recorder, a digital video player, a device for transmitting/receiving information in wireless environments, devices for home networks, devices for computer networks, devices for telematics networks, an RFID device, other devices for computing systems, etc.

According to an exemplary embodiment, the semiconductor memory device 1300 or the memory system 1000 may be packaged in various forms. For example, the semiconductor memory device 1300 or the memory system 1000 may be packaged by various methods such as a package on package (PoP), a ball grid array (BGA), a chip scale package (CSP), a plastic leaded chip carrier (PLCC), a plastic dual in line package (PDIP), a die in waffle pack, a die in wafer form, a chip on board (COB), a ceramic dual in line package (CERDIP), a plastic metric quad flat package (MQFP), a thin quad flat package (TQFP), a small outline integrated circuit (SOIC), a shrink small outline package (SSOP), a thin small outline package (TSOP), a system in package (SIP), a multi chip package (MCP), a wafer-level fabricated package (WFP), a wafer-level processed stack package (WSP), etc.

Figure 16:
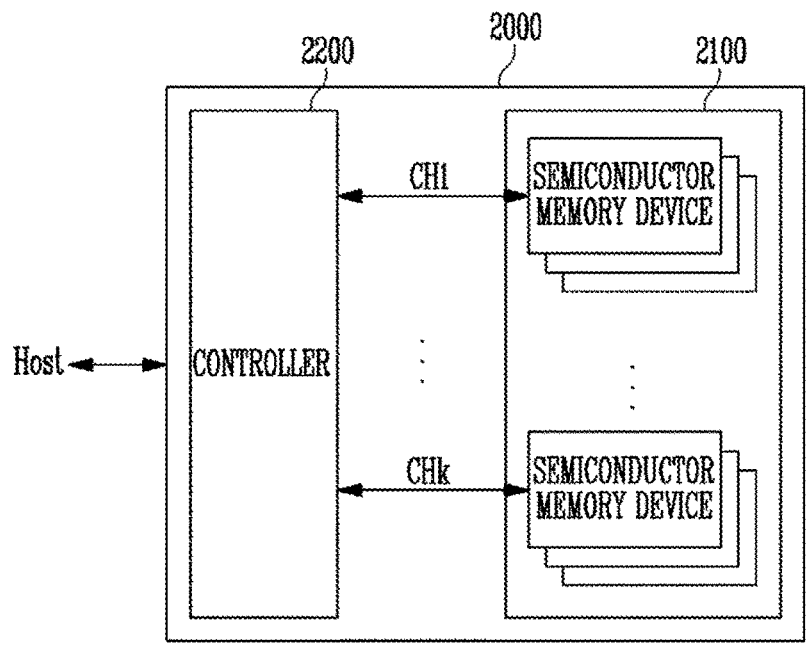
FIG. 16 is a block diagram illustrating an application example of a memory system shown in FIG. 15.

FIG. 16 is a block diagram illustrating an application example (2000) of the memory system 1000 shown in FIG. 15.

Referring to FIG. 16, a memory system 2000 may include a semiconductor memory device 2100 and a control unit 2200. The semiconductor memory device 2100 may include semiconductor memory chips. The semiconductor memory chips may be divided into groups.

FIG. 16 illustrates the groups communicating with the control unit 2200 through first to k-th channels CH1 to CHk. Each of the semiconductor memory chips may be configured and operated in substantially the same manner as the semiconductor memory device 100 described above with reference to FIG. 2.

Each group may communicate with the control unit 2200 through a single common channel. The control unit 2200 may be configured in substantially the same manner as the controller 1200 described with reference to FIG. 15, and configured to control the plurality of memory chips of the semiconductor memory device 2100.

As illustrated in FIG. 16, a plurality of semiconductor memory chips may be coupled to a single channel. However, the memory system 2000 may be modified so that a single semiconductor memory chip may be coupled to a single channel.

Figure 17:
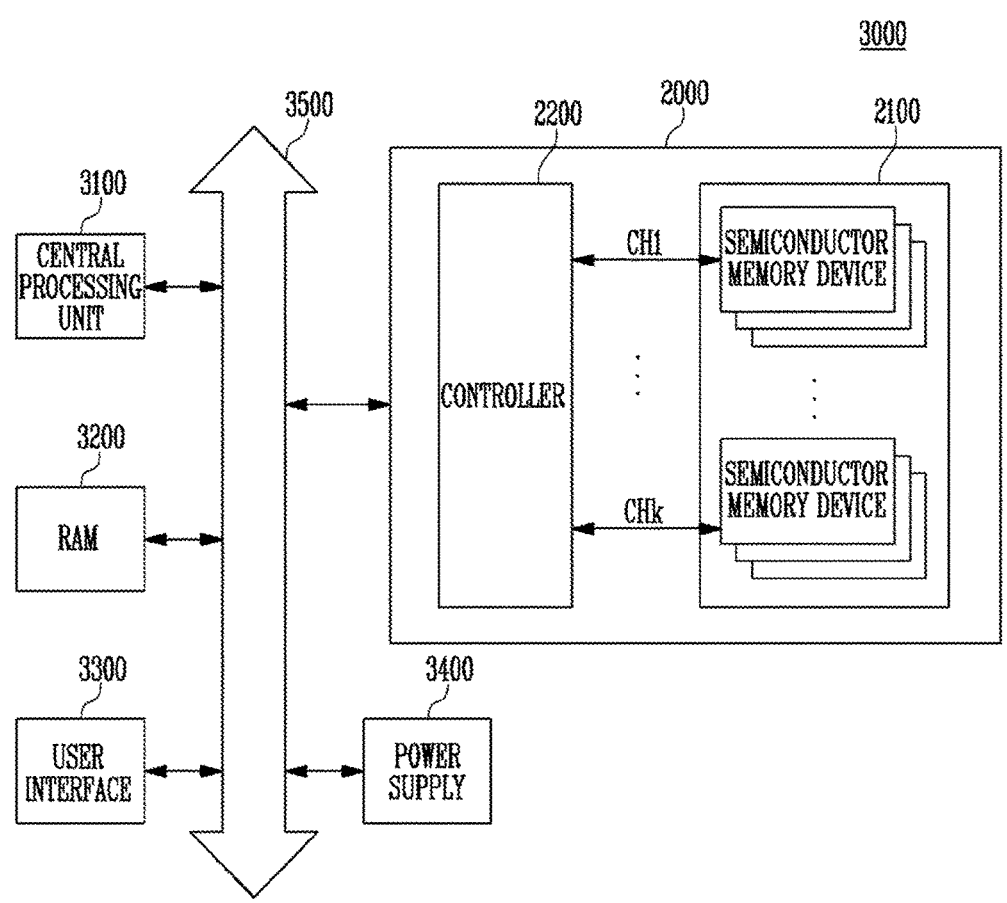
FIG. 17 is a block diagram illustrating a computing system including a memory system described with reference to FIG. 16.

FIG. 17 is a block diagram illustrating a computing system 3000 having the memory system 2000 described above with reference to FIG. 16.

Referring to FIG. 17, the computing system 3000 may include a central processing unit 3100, a random access memory (RAM) 3200, a user interface 3300, a power supply 3400, a system bus 3500, and the memory system 2000.

The memory system 2000 may be electrically connected to the central processing unit 3100, the RAM 3200, the user interface 3300, and the power supply 3400 through the system bus 3500. Data provided through the user interface 3300 or processed by the central processing unit 3100 may be stored in the memory system 2000.

In FIG. 17, the semiconductor memory device 2100 may be coupled to the system bus 3500 through the control unit 2200. However, the semiconductor memory device 2100 may be directly coupled to the system bus 3500. The central processing unit 3100 and the RAM 3200 may perform functions of the control unit 2200.

As illustrated in FIG. 17, the memory system 2000 shown in FIG. 16 may be provided as the memory system 3000. However, the memory system 2000 may be replaced with the memory system 1000 shown in FIG. 15. According to an embodiment, the computing system 3000 may include both of the memory systems 1000 and 2000 described above with reference to FIGS. 15 and 16.

According to an embodiment, a semiconductor memory device having improved reliability and an operating method thereof are provided.

The present disclosure provides a new operating method and circuits for implementing the same in line with a changed structure of a memory array to increase the degree of integration, thereby increasing operating characteristics and reliability.

What is claimed is:

1. A method of operating a semiconductor memory device including a plurality of memory cells, the method comprising:
   applying a program voltage pulse to a selected word line coupled to selected memory cells, among the plurality of memory cells; and
   applying a bit line voltage pulse to bit lines of at least one memory cell among the selected memory cells during the program voltage pulse is applied to the selected word line,
   wherein a voltage level of the bit line voltage pulse is changed from a program inhibition voltage to a program permission voltage during the program voltage pulse is applied to the selected word line,
   wherein the bit line voltage pulse has the voltage level of the program inhibition voltage during a first period, the bit line voltage pulse has the voltage level of the program permission voltage during a second period, and
   wherein the first and second periods are sequentially repeated while the program voltage pulse is applied to the selected word line.

2. The method of claim 1, wherein the first period and the second period have the same duration.

3. The method of claim 1, wherein one of the first and second periods has a greater duration than the other period.

4. The method of claim 1, further comprising verifying a program state of the selected memory cells by a first verify voltage and a second verify voltage greater than the first verify voltage before the applying of the program voltage to the selected word line coupled to the selected memory cells, among the plurality of memory cells.

5. The method of claim 4, wherein the selected memory cells have threshold voltages higher than the first verify voltage and lower than the second verify voltage.

6. The method of claim 4, wherein the first period is increased when threshold voltages of the selected memory cells are closer to the first verify voltage and the threshold voltages are between the first verify voltage and the second verify voltage.

7. The method of claim 4, wherein the second period is increased when threshold voltages of the selected memory cells are closer to the second verify voltage and the threshold voltages are between the first verify voltage and the second verify voltage.

8. The method of claim 1, wherein the voltage level of the program permission voltage is a ground voltage.

9. The method of claim 1, wherein the voltage level of the program inhibition voltage is a power voltage.

10. The method of claim 1, wherein the program permission voltage is a positive voltage having a higher voltage level than a ground voltage by a first reference value.

11. The method of claim 1, wherein the program inhibition voltage is a positive voltage having a lower voltage level than a power voltage by a second reference value.

12. A method of operating a semiconductor memory device including a plurality of memory cells, the method comprising:
   applying a program voltage to a selected word line coupled to selected memory cells, among the plurality of memory cells; and
   applying a bit line voltage having a voltage level increasing exponentially and then logarithmically from a program permission voltage to a program inhibition voltage or decreasing exponentially and then logarithmically from the program inhibition voltage to the program permission voltage during the application of the program voltage to the selected word line.

13. A method of operating a semiconductor memory device including a plurality of memory cells, the method comprising:
   applying a program voltage to a selected word line coupled to selected memory cells, among the plurality of memory cells; and
   sequentially applying a first voltage and a second voltage to bit lines coupled to the selected memory cells during the program voltage is applied to the selected word line,
   wherein the first voltage has a higher voltage level than a program permission voltage by a first reference value and
   the second voltage has a lower voltage level than a program inhibition voltage by a second reference value.

14. The method of claim 13, wherein the sequentially applying the first voltage and the second voltage to the bit lines coupled to the selected memory cells comprises:
   applying the first voltage after applying the second voltage, or applying the second voltage after applying the first voltage.

15. The method of claim 13, wherein the sequentially applying the first voltage and the second voltage to the bit lines coupled to the selected memory cells comprises: applying the first voltage during a first period in which the program voltage is applied, and applying the second voltage during a second period.

16. The method of claim 15,
   wherein the first period and the second period have the same duration.

17. The method of claim 15, wherein one of the first and second periods has a greater duration than the other period.

18. The method of claim 13,
   wherein the first voltage has a lower voltage level than the second voltage.

19. The method of claim 13,
   wherein the program permission voltage is a ground voltage.

20. The method of claim 13,
   wherein the program inhibition voltage is a power voltage.

* * * * *